United States Patent
Park et al.

(10) Patent No.: US 8,310,023 B2
(45) Date of Patent: *Nov. 13, 2012

(54) LIGHT EMITTING DIODE PACKAGE AND FABRICATION METHOD THEREOF

(75) Inventors: Ho Joon Park, Seoul (KR); Woong Lin Hwang, Kyungki-do (KR); Seog Moon Choi, Seoul (KR); Sung Jun Lee, Seoul (KR); Sang Hyun Choi, Seoul (KR); Chang Hyun Lim, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 806 days.

This patent is subject to a terminal disclaimer.

(21) Appl. No.: 12/360,444

(22) Filed: Jan. 27, 2009

(65) Prior Publication Data

US 2009/0137073 A1    May 28, 2009

Related U.S. Application Data

(62) Division of application No. 11/312,366, filed on Dec. 21, 2005, now abandoned.

(30) Foreign Application Priority Data

Feb. 23, 2005 (KR) .................. 10-2005-0015152

(51) Int. Cl.
  *H01L 23/52* (2006.01)
(52) U.S. Cl. .......... 257/503; 257/E21.511; 438/108
(58) Field of Classification Search .......... 257/E21.503, 257/E21.511; 438/108
  See application file for complete search history.

(56) References Cited

U.S. PATENT DOCUMENTS

| | | | |
|---|---|---|---|
| 5,788,357 A | 8/1998 | Muth et al. | |
| 6,384,473 B1 | 5/2002 | Peterson et al. | |
| 6,856,087 B2 | 2/2005 | Lin et al. | |
| 6,898,340 B2 | 5/2005 | Tanaka | |
| 7,649,208 B2 * | 1/2010 | Lee et al. | 257/82 |
| 7,816,156 B2 * | 10/2010 | Choi et al. | 438/22 |
| 2002/0149312 A1 | 10/2002 | Roberts et al. | |
| 2006/0001030 A1 | 1/2006 | Okuwaki et al. | |

FOREIGN PATENT DOCUMENTS

| | | |
|---|---|---|
| JP | 2003-046142 | 2/2003 |
| JP | 2003-218398 A | 7/2003 |
| JP | 2004-079750 | 3/2004 |

OTHER PUBLICATIONS

Japanese Office Action issued in Japanese Patent Application No. JP 2005-369625 dated Feb. 10, 2009.

* cited by examiner

*Primary Examiner* — Pho M Luu
(74) *Attorney, Agent, or Firm* — McDermott Will & Emery LLP

(57) ABSTRACT

The present invention provides an LED package and the fabrication method thereof. The present invention provides an LED package including a submount silicon substrate and insulating film and electrode patterns formed on the submount silicon substrate. The LED package also includes a spacer having a through hole, formed on the electrode patterns. The LED package further includes an LED received in the through hole, flip-chip bonded to the electrode patterns, and an optical element attached to the upper surface of the spacer.

7 Claims, 6 Drawing Sheets

LIGHT EMITTING DIODE PACKAGE AND FABRICATION METHOD THEREOF

RELATED APPLICATIONS

This application is a Divisional of U.S. application Ser. No. 11/312,366, filed Dec. 21, 2005, now abandoned claiming priority of Korean Patent Application No. 2005-0015152, filed Feb. 23, 2005, the entire contents of each of which are hereby incorporated by reference.

BACKGROUND OF THE INVENTION

1. Field of the Invention

The present invention relates to a light emitting diode (LED) package and a fabrication method thereof, and more particularly, to an LED package which is superior in heat discharge quality, and compact in size, appropriate for mass production, and to a fabrication method thereof.

2. Description of the Related Art

Recently, a light emitting diode (LED) using a compound of semiconductor material such as GaAs, AlGaAs, GaN, and AlGaInP has been developed to realize diverse colors of light source. The factors contributing to the characteristics of LED products include color, luminance, and light-conversion efficiency. The characteristics of an LED product are influenced by the primary factors including the compound and structure of semiconductor material used in the LED, and also greatly by the secondary factors including package structure for mounting the LED. In order to obtain light-emitting effects appropriate for the user needs, not only the primary factors such as material and structure of the LED, but also the secondary factors such as the structure and material of the LED package need to be improved as well.

In general, in order to use an LED chip for illumination, a high output of light needs to be generated, with light-conversion efficiency of 100 lm/W or more. Since the LED chip is driven with high input power, more than 70% of input power is converted into heat. Therefore, the operation of the LED generates much heat, which needs to be discharged. If the heat is not sufficiently discharged, the temperature of the LED increases, rapidly diminishing the light-conversion efficiency. Therefore, there have been efforts to effectively discharge the heat generated from the LED in a high-output LED package. In order to improve the heat discharge quality of the LED package, Japanese Laid-Open Patent Application No. 2003-218398 discloses techniques of using a separated metal substrate with a narrow slit for an LED package substrate.

In addition, with the current trend of miniaturization and light weight of electronic components, there has been an increasing demand for a very thin, compact size LED package. For example, the LED package used in the backlight unit of the LCD or the camera flash needs to be manufactured in compact size, which in turn, miniaturizes the backlight unit or camera flash. However, the conventional LED packages have not satisfied such needs described above, and also the manufacturing process is complicated.

FIG. 1 is a sectional view illustrating an overall structure of a conventional LED package 10. This LED package 10 uses air as the medium of light. Referring to FIG. 1, the LED package 10 includes a metal substrate 2 with a narrow slit 6, a spacer 4 made of insulating substrate, and a cover plate 9 made of transparent glass. The slit is filled with insulator 3 such as epoxy resin, so that the metal substrate 4 forms two electrodes 2a and 2b that are separated from each other. The metal substrate 2, the spacer 4, and the cover plate 9 are adhered to each other by adhesive sheets 5 and 8 interpositioned between them. In the center of the spacer 4, a cavity or a through hole 4b is formed, and an LED chip 7 is received in the through hole 4b. The side surface of the through hole 4b is coated with a metal film 11. This metal film 11 functions as a reflective surface on which the LED light emitted to the side is reflected upward. The LED 7 is flip-chip bonded to the two electrodes 2a and 2b of the metal substrate 2 via bumps 7a and 7b. The gap between the LED 7 and the metal substrate 2 may be filled with underfill resin.

The LED package 10 uses a metal substrate 2 to enhance the discharge quality of the heat generated from the LED 7. However, in order to manufacture the conventional LED package with the above construction, the metal substrate 2 needs to be finely processed to divide the metal substrate 2 in parts by a narrow slit 6. Therefore, the fabrication process of the LED package 10 is not easy, hindering obtainment of a sufficiently thin, compact size package. Furthermore, it is difficult to flip-chip bond the LED chip 7 precisely on the two electrodes 2a and 2b such that the LED chip 7 is positioned between the two bumps 7a and 7b.

SUMMARY OF THE INVENTION

The present invention has been made to solve the foregoing problems of the prior art and it is therefore an object of the present invention to provide a light emitting diode (LED) package which is thinner with compact size, effectively discharging the heat generated from an LED.

It is another object of the invention to provide a fabrication method of an LED package, which is capable of manufacturing a compact size LED package which is superior in heat discharge quality, and appropriate for the mass-production of a plurality of LED packages.

In order to realize the above described object, the LED package according to the present invention includes: a submount silicon substrate; an insulating film and electrode patterns formed on the insulating film; a spacer having a through hole, formed on the electrode patterns; an LED received in the through hole, flip-chip bonded to the electrode patterns; and a planar optical element adhered to the upper surface of the spacer.

According to an embodiment of the present invention, the spacer may be made of silicon, in which case, the side surface of the through hole in the spacer may function as a reflective surface. In addition, a reflective metal film may be coated on the side surface of the through hole of the spacer made of silicon. This metal film may be made of Ag or Al.

According to another embodiment of the present invention, the spacer may be made of insulating resin such as epoxy. In this case, it is preferable that a reflective metal film made of Ag or Al, is coated on the side surface of the spacer made of insulating resin.

According to an embodiment of the present invention, it is preferable that the insulating film formed on the submount silicon substrate is a thermal oxide film. The thermal oxide film can have a small thickness of about 5000 Å, which does not hinder the heat discharge quality.

According to an embodiment of the present invention, the planar optical element may be made of transparent glass or transparent polymer material. For example, the planar optical element may be a transparent plastic substrate made of polymethylmethacrylate (PMMA). In addition, the planar optical element may be a fresnel lens. Alternatively, the planar optical element may be adapted to divide light via grating, or may be adapted to divide light via a volume hologram or a plane hologram (surface hologram). Moreover, the planar optical element may be a diffusion plate which divides light.

In order to realize another object of the present invention, the fabrication method of the LED package includes steps of: forming an insulating film and then electrode patterns on a submount silicon substrate; mounting an LED on the electrode patterns by flip-chip bonding; placing a spacer having a through hole on the electrode patterns to receive the LED in the through hole; and adhering a planar optical element to the upper surface of the spacer.

According to an embodiment of the present invention, the step of placing a spacer on the electrode patterns includes: selectively etching a silicon substrate to form a through hole therein; and adhering the silicon substrate with the through hole to the electrode patterns. In this case, in order to increase reflectivity, a reflective metal film may be coated on the side surface of the through hole in the silicon substrate.

According to another embodiment of the present invention, the step of placing a spacer on the electrode patterns includes: forming a through hole in an insulating resin substrate; and adhering the insulating resin substrate with the through hole formed therein to the electrode patterns. In this case, it is preferable that a reflective metal film made of Ag or Al is coated on the side surface of the through hole in the insulating resin substrate.

According to an embodiment of the present invention, the insulating film may be formed by thermally oxidizing the submount silicon substrate. With thermal oxidization of the submount silicon substrate, a $SiO_2$ film can be formed in a thickness of about 5000 Å on the submount silicon substrate.

The fabrication method of the LED package may be easily adapted to fabricate a plurality of LED packages at the same time, using a silicon substrate such as a silicon wafer. In this case, the silicon substrate may be used as the submount substrate. The LED package array formed with the silicon substrate may be diced into individual LED packages to obtain a plurality of LED packages at the same time.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
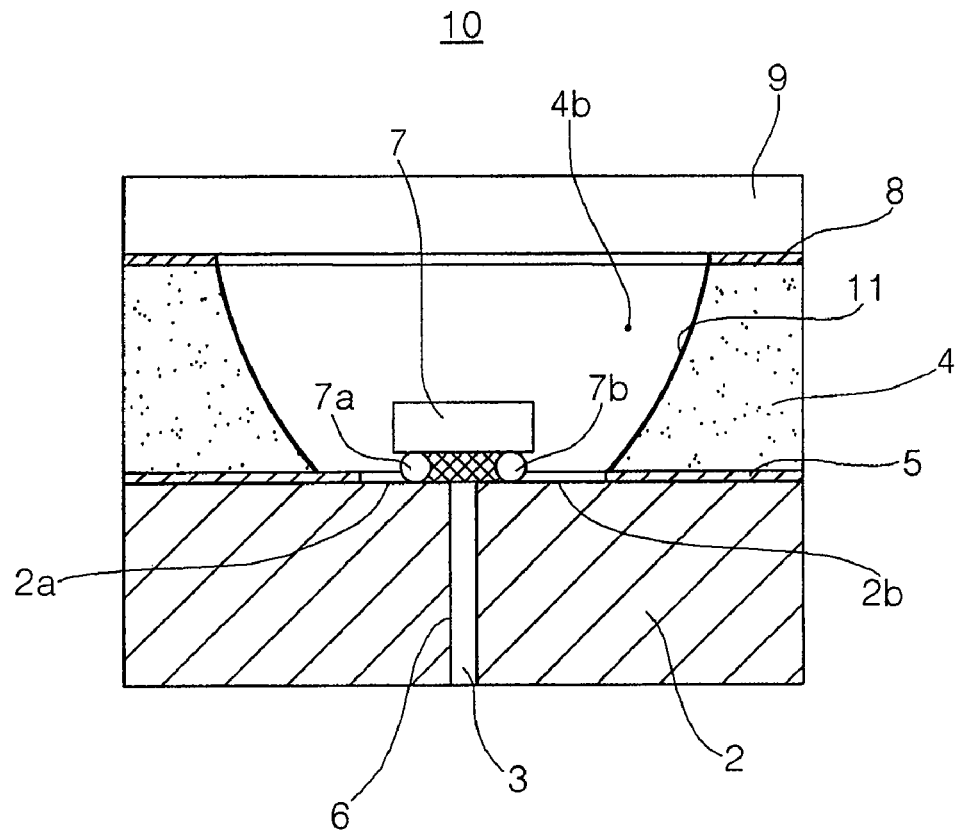
FIG. 1 is a sectional view illustrating a conventional LED package.

Preferred embodiments of the present invention will now be described in detail with reference to the accompanying drawings.

While the present invention will be shown and described in connection with the preferred embodiments, it will be apparent to those skilled in the art that modifications and variations can be made without departing from the spirit and scope of the invention as defined by the appended claims.

The embodiments of the present invention are only aimed to provide a full explanation to a person having ordinary skill in the art. Therefore, the shape and size of the elements in the diagrams may be exaggerated for clearer explanation, with the same reference numerals designating the same elements throughout the drawings.

Figure 2:
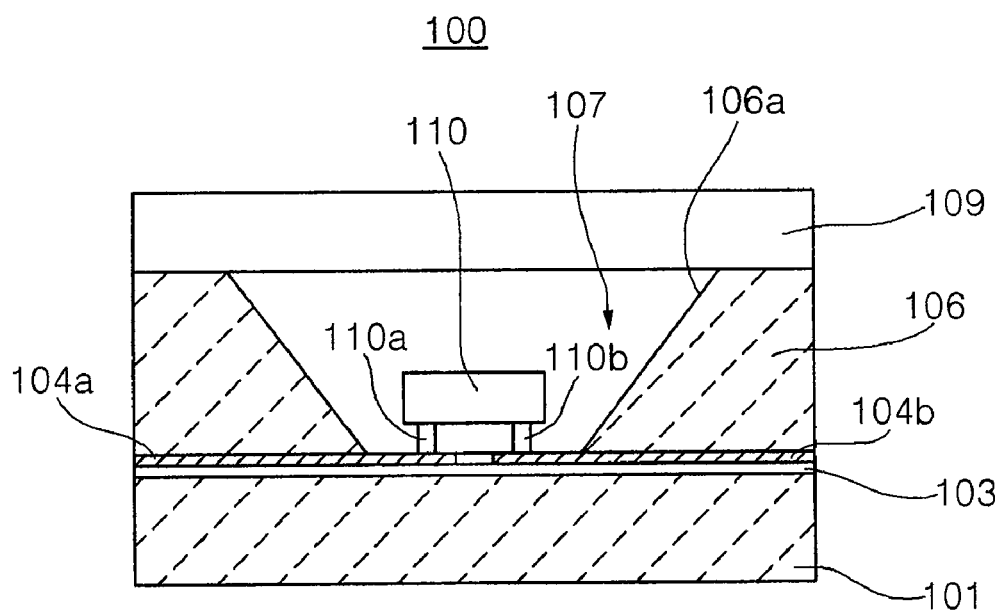
FIG. 2 is a sectional view illustrating an LED package according to an embodiment of the present invention.

FIG. 2 is a sectional view illustrating an LED package according to an embodiment of the present invention. Referring to FIG. 2, an insulating film 103 and electrode patterns 104a and 104b are formed on a submount silicon substrate 101. The electrode patterns 104a and 104b includes a pair of electrodes separated from each other. The insulating film 103 functions to prevent short-circuit of the pair of electrodes 104a and 104b, and the silicon substrate 101 is a thermal oxide film ($SiO_2$) obtained from thermally oxidizing the silicon substrate 101.

On the electrode patterns 104a and 104b, a spacer 106 made of silicon having a cavity or through hole 107 is adhered thereto by adhering means (not shown) such as an adhesive sheet. The side surface 106a of the through hole 107 in the spacer 106 functions as a reflective surface. Inside the through hole 107, an LED 10 is flip-chip bonded to the electrode patterns 104a and 104b via solder bumps 110a and 110b. The light emitted to the side is reflected upward by the side surface 106a. On the upper surface of the spacer 106, a planar optical element 109 is adhered thereto by adhering means (not shown) such as an adhesive sheet.

The LED package 100 uses a silicon substrate 101 for the submount substrate. The silicon substrate 101 may have a thickness less than that of the metal substrate 2 (FIG. 1) with a narrow slit. Therefore, the LED package 100 can have a thickness less than that of the conventional LED package 10.

As the heat conductivity of silicon is equally great as metal, the silicon substrate 101 is advantageous in heat discharge. In addition, the insulating film 103 is a thermal oxide film, which can be formed in a small thickness of about 5000 Å. Therefore, the blocking effect of the heat discharge by the insulating film 103 can be minimal. Using the silicon substrate 101 having high heat conductivity, and the insulating film 103 of a thin thermal oxide film, the heat generated from the LED during the operation of LED may be effectively discharged.

The spacer 106 is made of silicon, and therefore, without using a reflective metal film, the side surface 106a of the through hole 107 can be used as a reflective surface. For example, a selective wet-etching can be conducted on a silicon substrate to form the silicon spacer 106 with the through hole 107 and the reflective surface 106a thereon in a single step. Silicon is material that is easy to process, which allows convenient control of the precise degree of the angle and roughness of the reflective surface. However, a metal film (not shown) made of Ag or Al may be coated on the side surface 106a of the through hole 106 to increase the reflectivity.

The planar optical element 109 functions as a cover plate sealing the LED 110. The planar optical element 109 may be formed of transparent glass or transparent polymer material such as polymethylmethacrylate (PMMA). The planar optical element 109 may be a transparent substrate or a convex lens in a simple shape of plate. In addition, the planar optical element 109 may be an optical device having special functions such as concentrating or dividing the light emitted from the LED. For example, the planar optical element 109 may be a fresnel lens. Moreover, the planar optical element 109 may be adapted to divide light via grating or may be adapted to divide light via a volume hologram or plane hologram (surface hologram). In addition, a diffusion plate which injects light can also be used as the planar optical element 109.

Figure 3:
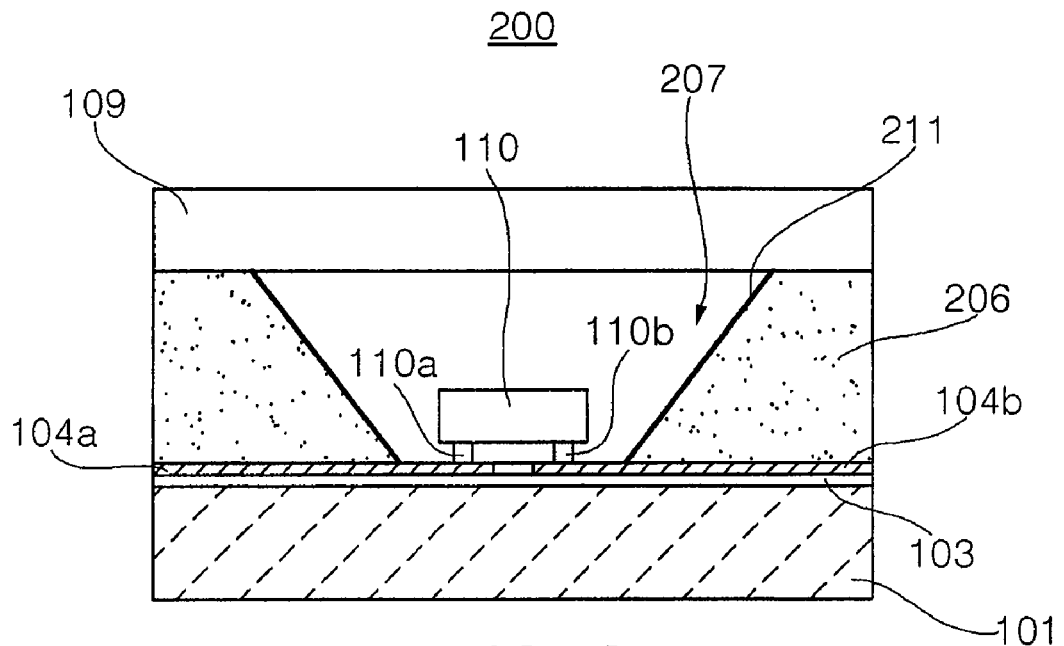
FIG. 3 is a sectional view illustrating an LED package according to another embodiment of the present invention.

FIG. 3 is a sectional view illustrating an LED package according to another embodiment of the present invention. The LED package 200 of FIG. 3 is different from the LED package of FIG. 2 in that the spacer 206 is formed of insulating resin such as epoxy resin. In general, insulating resin is low in reflectivity compared with metal or silicon, and therefore, it is preferable that a reflective metal film 211 of for example, Al or Ag is coated on the side surface of the through hole 207. This reflective metal film 211 functions as a reflective surface on which the light emitted from the LED to the side is reflected upward (projection direction).

Figure 9:
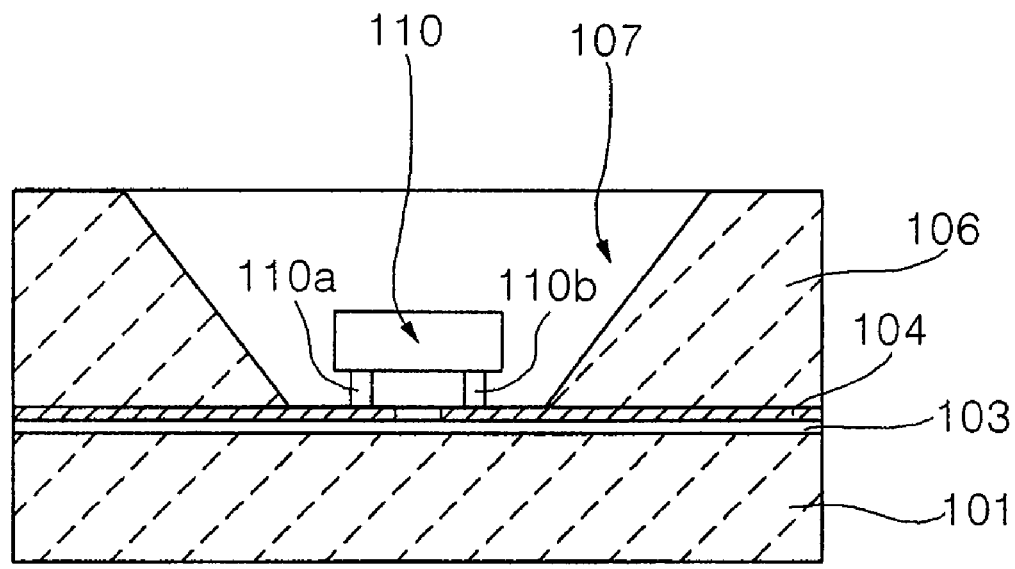
Figure 10:
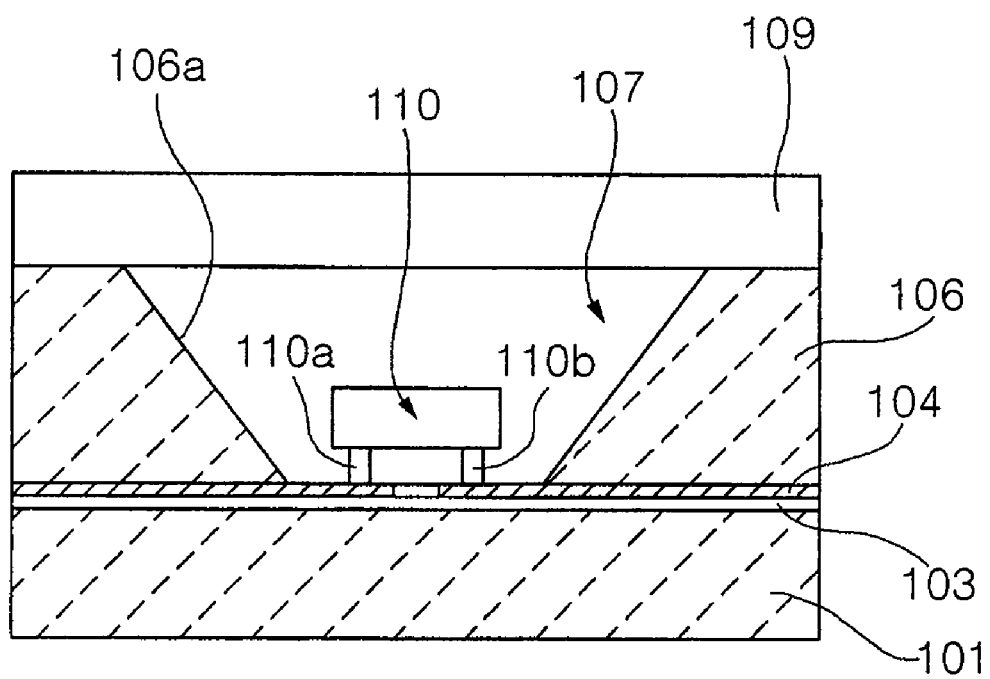
Figure 11:
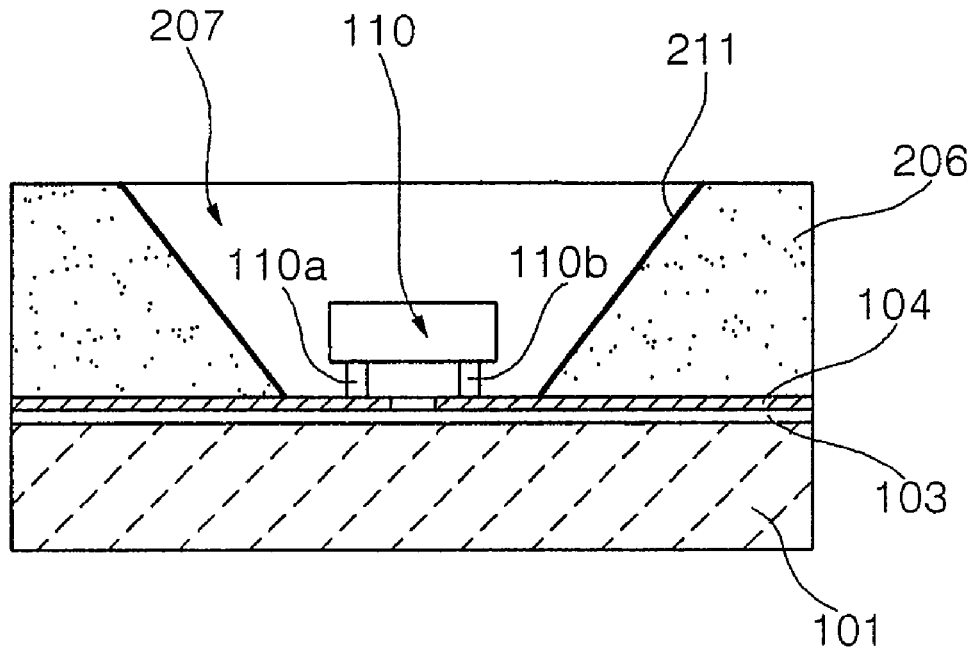
FIGS. 11 and 12 are sectional views illustrating a fabrication method according to another embodiment of the present invention.
Figure 12:
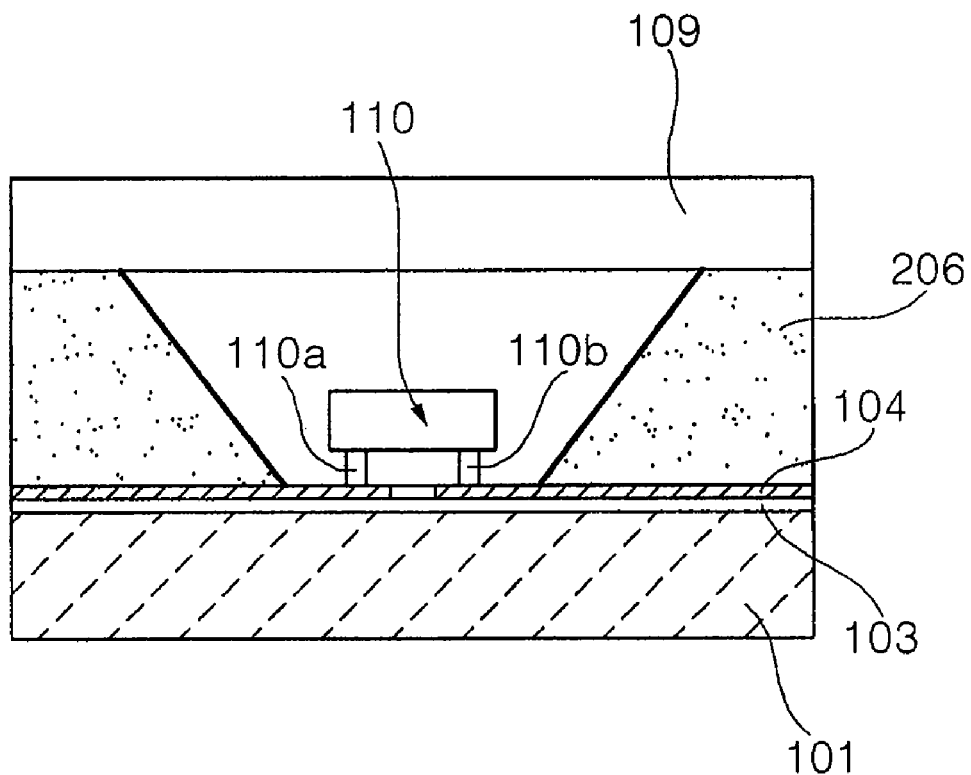

With reference to the accompanying FIGS. 4 through 12, the fabrication methods of the LED packages according to embodiments of the present invention are described. FIGS. 4 through 10 are sectional views illustrating a fabrication method of an LED package having a silicon spacer, whereas FIGS. 11 and 12 are sectional views illustrating a fabrication method of an LED package having an insulating resin spacer.

Figure 4:
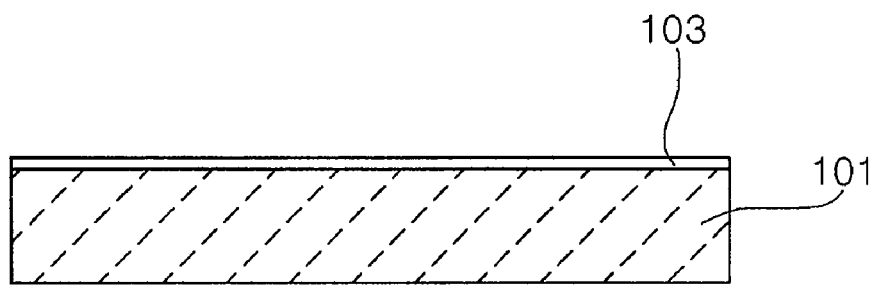
FIGS. 4 through 10 are sectional views illustrating a fabrication method according to an embodiment of the present invention.
Figure 5:
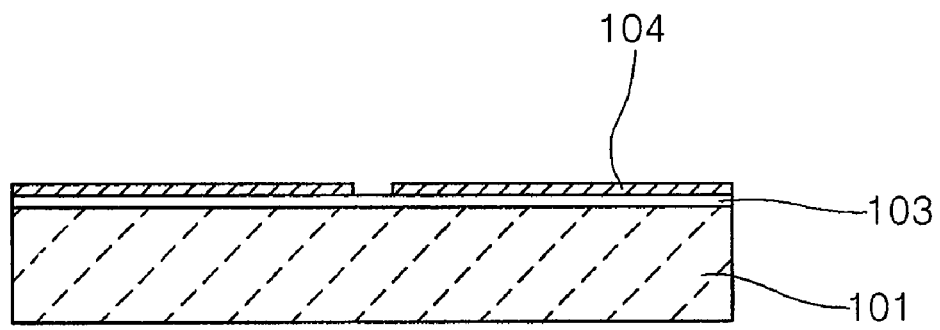
Figure 6:
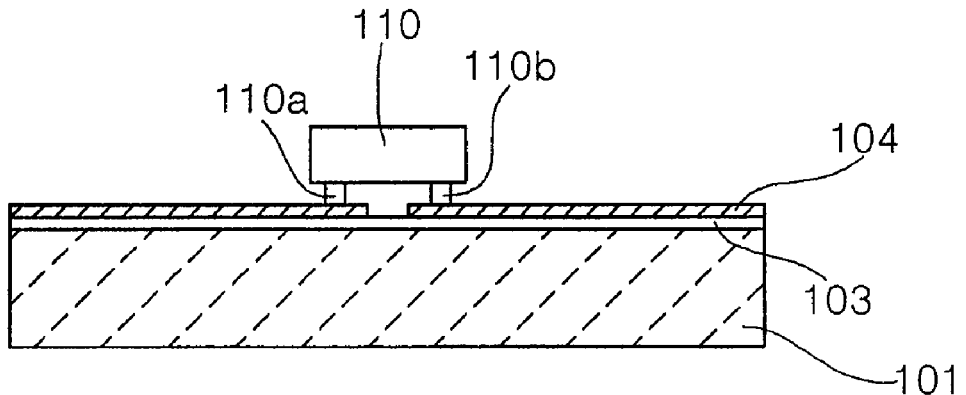

First, referring to FIG. 4, a submount silicon substrate 101 is thermally oxidized to form an insulating film 103 made of $SiO_2$ on the substrate 101. The insulating film 103 may be formed in a small thickness of about 5000 Å. Next, as shown in FIG. 5, electrode patterns 104 having a pair of electrodes are formed on the insulating film 103. The electrode patterns 104 may be formed of a Ag/Ni/Au layer. Thereafter, as shown in FIG. 6, an LED 110 is adhered to the electrode patterns 104 to be mounted on the submount. At this time, the LED 110 is flip-chip bonded to the electrode patterns 104 via solder bumps.

Figure 7:
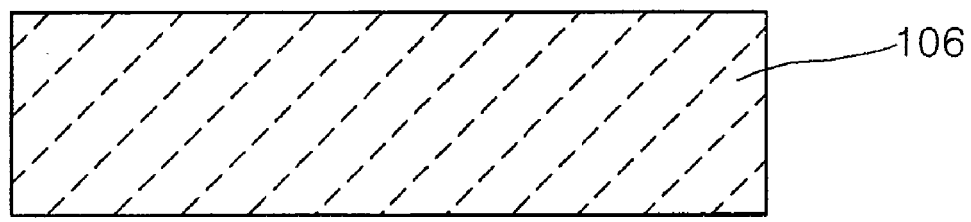
Figure 8:
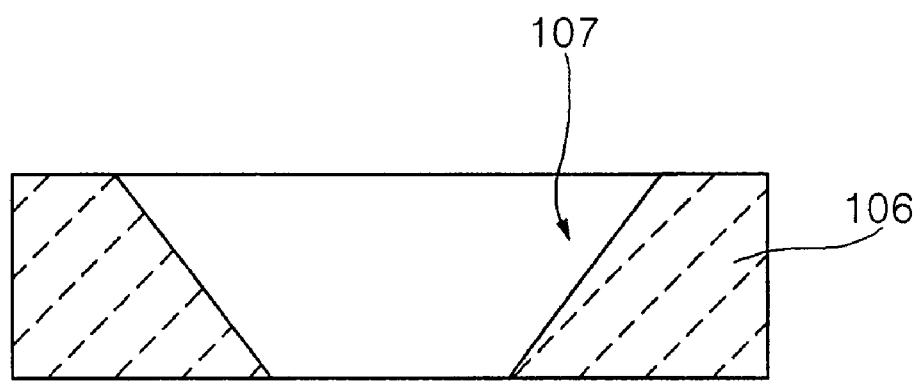

Next, as shown in FIG. 7, a silicon substrate 106' is prepared for the fabrication of a spacer. This silicon substrate 106' is selectively wet-etched, forming a cavity or through hole 107 therein as shown in FIG. 8. Accordingly, the spacer made of silicon is obtained, which is to be subsequently adhered to the submount substrate. It is desirable that the through hole 107 is formed in the center of the spacer 106. The side surface of the through hole 107 may function as a reflective surface as described above. In order to increase the reflectivity, a metal film of for example, Al or Ag may be coated on the side surface of the through hole 107.

Thereafter, as shown in FIG. 9, the fabricated spacer 106 is adhered to the electrode patterns 104. This adhesion can be done via an adhesive sheet (not shown) inserted between the spacer 106 and the electrode patterns 104. As the spacer 106 is adhered, the mounting area of the through hole 107 is aligned with that of the LED 110, so that the LED 110 is recived inside the through hole 107.

Next, as shown in FIG. 10, a planar optical element 109 is adhered to the top of the spacer to obtain the LED package according to this embodiment. The planar optical element 109 can be adhered to the spacer 106 using an adhesive sheet (not shown) inserted between the spacer 106 and the planar optical element 109. As described above, the planar optical element 109 may be a simple, plate-shaped transparent substrate or an optical device such as fresnel lens having a diverse optical functions. Since this embodiment uses the spacer 106 formed from wet-etching the silicon substrate 106', the side surface 106a of the through hole 106 can be used as a reflective surface without a reflective metal film coated thereon.

Unlike the conventional art, the above described fabrication method of the LED package uses a silicon substrate 101 rather than a metal substrate 2 (FIG. 1). In addition, there is no need to form a narrow slit 6 (FIG. 1) on the submount substrate. Therefore, the manufacturing process of the LED package is facilitated, compared with the conventional art.

The above described fabrication method of the LED package uses a spacer of silicon material. However, in another embodiment, the spacer may be formed with insulating resin. The same process described with reference to FIGS. 1 through 6 may be adapted to the fabrication of the LED package with the insulating resin spacer. Thereafter, as shown in FIG. 11, the insulating resin spacer 206 formed with a through hole 207 therein is prepared and adhered to the electrode patterns 104. The spacer 206 can be formed using, for example, epoxy resin. As insulating resin is lower in reflectivity than metal or silicon, it is preferable that a metal film 211 made of Ag or Al is coated on the side surface of the through hole 207. As shown in FIG. 12, after adhering the insulating resin spacer 206 to the electrode patterns 104, a planar optical element 109 is adhered to the upper surface of the spacer 206 to obtain an LED package.

The fabrication method of the present invention can be easily adapted to simultaneous fabrication of a plurality of LED packages using a silicon substrate such as a silicon wafer. That is, the identical fabrication method of the LED package described above can be adapted to form an LED package array on a single silicon substrate. In this case, the silicon substrate is used as the submount substrate. The LED package array formed by the above process is diced into individual LED packages, obtaining a plurality of LED packages at the same time. An example of the fabrication method of the LED package array is illustrated in FIGS. 13 and 14.

Figure 13:
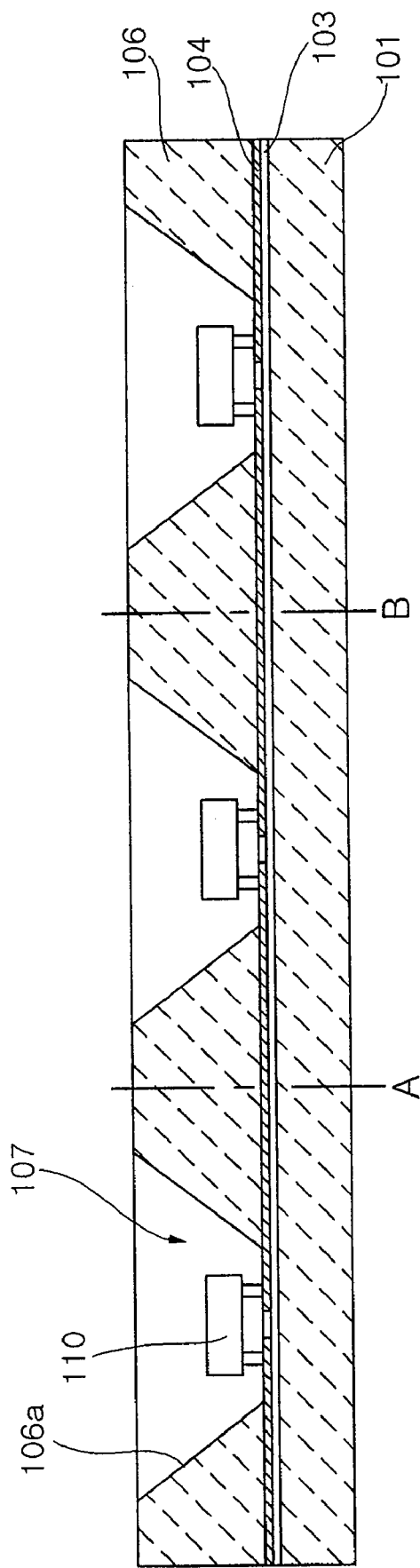
FIGS. 13 and 14 are sectional views illustrating a method of fabricating a plurality of LED packages according to an embodiment of the present invention.

First, as shown in FIG. 13, an insulating film 103 is formed by thermal oxidization on a silicon substrate 101 such as a silicon wafer, followed by forming a plurality of electrode patterns 104 on the insulating film 103. Thereafter, a plurality of LEDs 110 are flip-chip bonded to the plurality of electrode patterns 104, and a spacer 106 having a plurality of reflective surfaces 106a and through holes 107 are adhered to the electrode patterns 104. The mounting positions of the LEDs 110 and through holes 107 are predetermined to receive each LED chip in each through hole 107.

Figure 14:
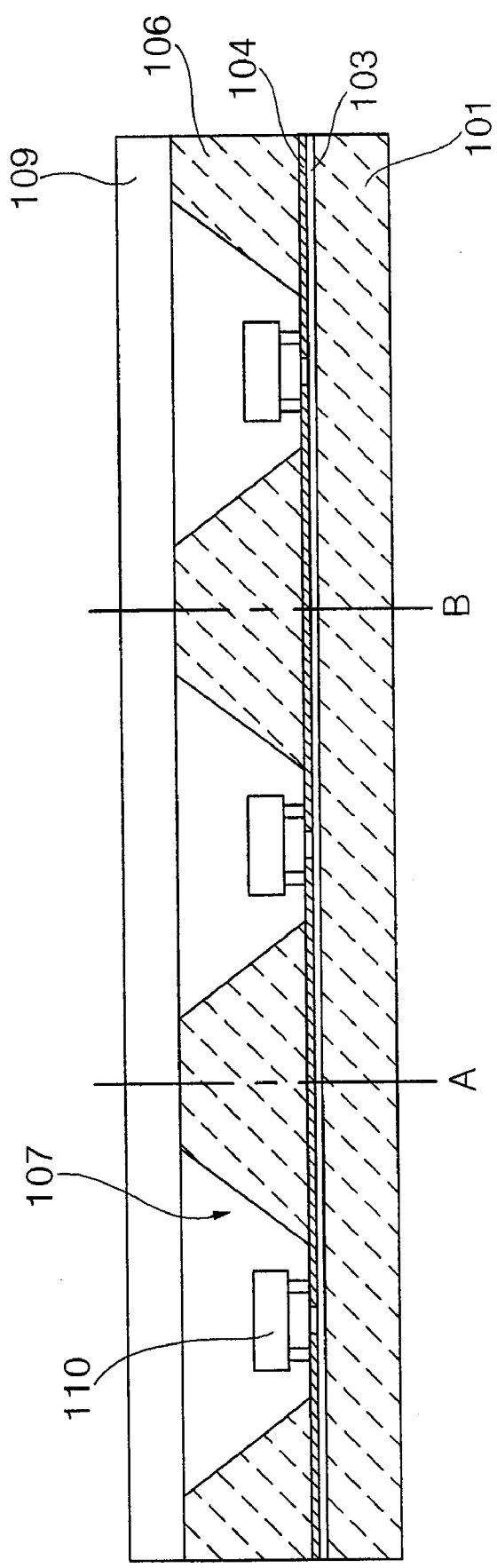

Next, as shown in FIG. 14, a planar optical element 109 is adhered to the upper surface of the spacer 106 to seal over the LED 110. Accordingly, an LED package array with a plurality of LED chips 110 is completed. Thereafter, the package array is diced along the dicing lines A and B into a plurality of LED packages according to the present invention. Since a substrate 101 made of silicon, instead of metal, is used, the dicing can be conducted more conveniently. As described above, the fabrication method of the LED package of the present invention can easily be adapted to the fabrication of the LED package array, appropriate for the mass-production of the LED packages.

The present invention as set forth above uses a silicon substrate for the submount substrate, effectively discharging the heat generated from the LED, and realizing a thinner, compact size LED package. In addition, the fabrication process of the LED package according to the present invention is relatively easy, appropriate for fabrication of a plurality of LED packages at the same time. Therefore, the present invention allows the mass-production of high-quality LED packages at lower costs.

What is claimed is:
1. A fabrication method of a light emitting diode package comprising steps of:
    forming an insulating film and electrode patterns on the insulating film on a submount silicon substrate;
    mounting an LED on the electrode patterns by flip-chip bonding;
    placing a spacer having a through hole on the electrode patterns to dispose the LED in the through hole; and adhering a planar optical element to the upper surface of the spacer.

2. The fabrication method of the light emitting diode package according to claim 1, wherein the step of placing a spacer on the electrode patterns comprises selectively etching a silicon substrate to form the through hole therein, and adhering the silicon substrate with the through hole to the electrode patterns.

3. The fabrication method of the light emitting diode package according to claim 2, further comprising a step of coating a reflective metal film on the side surface of the through hole in the silicon substrate.

4. The fabrication method of the light emitting diode package according to claim 1, wherein the step of forming a spacer on the electrode patterns comprises forming the through hole in an insulating resin substrate, and adhering the insulating resin substrate with the through hole formed therein to the electrode patterns.

5. The fabrication method of the light emitting diode package according to claim 4, further comprising a step of coating a reflective metal film on the side surface of the through hole in the insulating resin substrate.

6. The fabrication method of the light emitting diode package according to claim 1, wherein the insulating film is formed by thermally oxidizing the submount silicon substrate.

7. A fabrication method of light emitting diode packages comprising steps of:
    forming an insulating film and a plurality of electrode patterns in their order on a silicon substrate;
    mounting a plurality of LEDs on the electrode patterns by flip-chip bonding;
    placing a spacer having a plurality of through holes on the plurality of electrode patterns to dispose each of the plurality of LEDs in each of the through holes;
    adhering a planar optical element to the upper surface of the spacer; and
    dicing a resultant structure with the planar optical element adhered thereto into individual LED packages.

* * * * *